Figure 1:
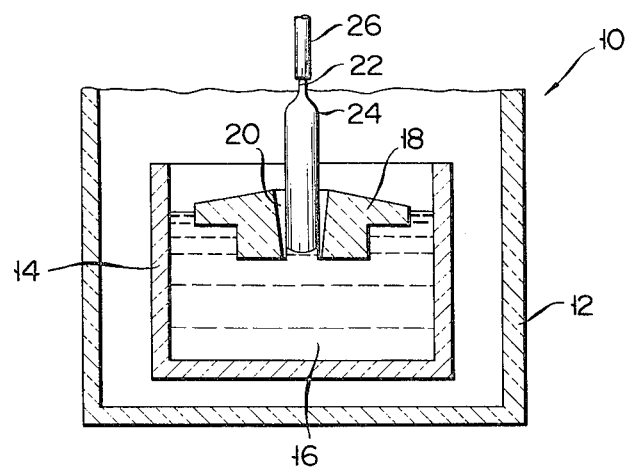

United States Patent [19]

Nakamura et al.

[11] 4,230,494
[45] Oct. 28, 1980

[54] ARTICLE HIGHLY RESISTANT TO CORROSION BY GALLIUM PHOSPHIDE AND GALLIUM ARSENIDE

[75] Inventors: Kiyoshi Nakamura; Michiyasu Komatsu; Masae Nakanishi, all of Yokohama, Japan

[73] Assignee: Tokyo Shibaura Denki Kabushiki Kaisha, Kawasaki, Japan

[21] Appl. No.: 924,358

[22] Filed: Jul. 13, 1978

[30] Foreign Application Priority Data

Jul. 14, 1977 [JP] Japan .................................. 52/83557

[51] Int. Cl.$^3$ ...................... C04B 35/10; C04B 35/58; C09K 3/00
[52] U.S. Cl. ................................. 106/14.05; 106/73.4; 106/73.5; 106/286.5; 106/286.8
[58] Field of Search ............... 106/286.5, 286.8, 14.21, 106/73.4, 73.5, 14.05; 156/616 A; 423/299

[56] References Cited

U.S. PATENT DOCUMENTS

| 3,602,984 | 9/1971 | Trent | 29/578 |
| 4,025,351 | 5/1977 | Masak | 106/73.5 |
| 4,083,748 | 4/1978 | Gault | 156/616 A |
| 4,143,107 | 3/1979 | Ishii et al. | 106/73.5 |

Primary Examiner—Theodore Morris
Attorney, Agent, or Firm—Oblon, Fisher, Spivak, McClelland & Maier

[57] ABSTRACT

An article has a portion contacted by gallium phosphide or gallium arsenide. At least the contacting portion is formed of a sintered body of a mixture of silicon nitride and an additive, and part or the whole of the additive is present as a crystallized phase in the sintered silicon nitride system.

4 Claims, 2 Drawing Figures

ARTICLE HIGHLY RESISTANT TO CORROSION BY GALLIUM PHOSPHIDE AND GALLIUM ARSENIDE

FIELD OF THE INVENTION

This invention relates to an article highly resistant to corrosion by gallium phosphide and gallium arsenide, and more particularly to an article prepared from a silicon nitride base sintered body.

DESCRIPTION OF THE PRIOR ART

At present, a single crystal of gallium phosphide (GaP) or gallium arsenide (GaAs) is formed by placing a raw material in a crucible for thermal melting and resting a float bored at the center on said molten mass. A seed crystal is brought into contact with the molten mass in the opening of the float. When the seed crystal is slowly pulled up, while being rotated, if necessary, a desired single crystal is produced with the cross section shaped like the outline of the float opening.

The above-mentioned float is contacted by a molten mass of gallium phosphide or gallium arsenide throughout the growth of a single crystal thereof, and therefore it is demanded to have a high resistance to corrosion by said raw material, a high mechanical strength, and a prominent resistance to thermal shocks. The reason is that the float is subject to a mechanical stress, for example, when a fully grown single crystal is taken out of a crucible, or thermally damaged by a hot molten mass of a raw material.

In view of the above-mentioned events, it is preferred that the float be prepared from a sintered body of a silicon nitride.

Where, however, a silicon nitride is sintered, it is often practised to add, for example, magnesia (MgO) to promote the sintering. According to the customary practice, the magnesia gives rise to the growth of vitreous matter in the sintered silicon nitride. The vitreous portion of the sintered body is ready to be corroded by gallium phosphide or gallium arsenide. Further, such sintered body decreases in mechanical strength and resistance to thermal shocks.

It is accordingly an object of this invention to provide an article highly resistant to corrosion by gallium phosphide or gallium arsenide.

Another object of the invention is to provide an article prepared from an improved sintered body of silicon nitride base.

These and other objects which will be apparent from the following description are attained according to the invention by providing an article having a portion contacted by gallium phosphide or gallium arsenide, at least said contacting portion being formed of a sintered body of a mixture of silicon nitride and an additive, and at least part of the additive being present as a crystallized phase in the sintered silicon nitride structure.

Figure 2:
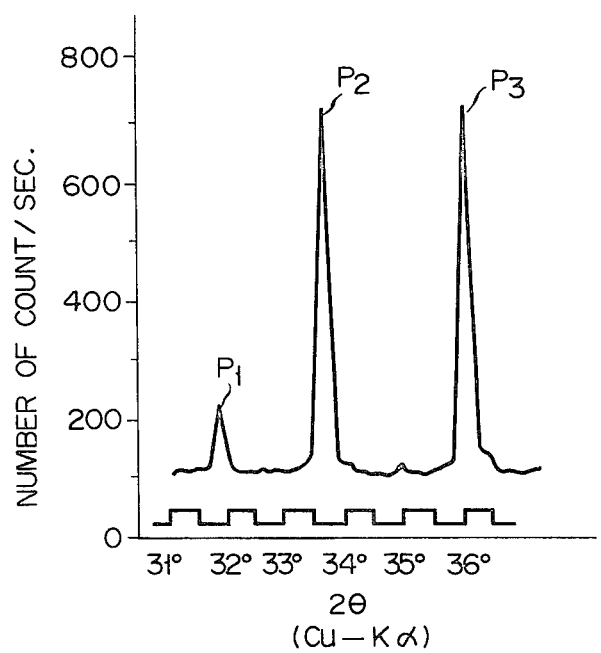

This invention can be more fully understood from the following detailed description when taken in conjunction with the accompanying drawings, in which:

FIG. 1 is a schematic sectional view of an apparatus using an article embodying this invention; and FIG. 2 is an X-ray diffraction graph of the article of the invention.

As mentioned above, the article of this invention has a portion which is contacted by gallium phosphide or gallium arsenide, and at least the contacting portion, preferably the whole of the article, is constituted by a silicon nitride base sintered body. The sintered body is provided by sintering a mixture of silicon nitride and an additive. At least part (generally 20% or more, preferably 40% or more) of the additive is present as a crystallized phase in the sintered silicon nitride system.

The additive present as a crystallized phase in the sintered silicon nitride system forms a solid solution or compound with silicon nitride. An additive element capable of forming a solid solution with silicon nitride includes aluminum, magnesium, lithium, gallium, germanium, titanium and beryllium. An additive element capable of forming a compound with silicon nitride includes yttrium, cerium and the like. These additive elements are sintered with silicon nitride generally in the form of an oxide or nitride. An additive to be sintered with silicon nitride in the form of an oxide includes aluminum oxide ($Al_2O_3$), yttrium oxide ($Y_2O_3$) and cerium oxide ($CeO_2$). Where an additive is sintered with silicon nitride in the form of an oxide, an oxynitride is formed. It is possible to apply a mixture of an additive capable of forming a solid solution with silicon nitride and an additive capable of forming a compound with silicon nitride. In this case, a phase of a solid solution and a phase of a compound are present in the sintered system.

An amount of an additive to be added ranges between 0.5% and 20%, or preferably between 0.5% and 10% based on the total weight of silicon nitride, though varying with the kind of additive used. Preferred additives of aluminum oxide, yttrium oxide and cerium oxide are mixed with silicon nitride in an amount ranging from 0.1% to 10% (preferably from 0.5% to 5%), from 0.5% to 20% (preferably from 0.5% to 7%), and from 0.5% to 20% (preferably from 0.5% to 7%), respectively, based on the total weight of silicon nitride. A thorough mixture of powdered silicon nitride and that of an additive is sintered in an atmosphere of inert gas such as nitrogen at a temperature ranging between 1300° C. and 2000° C., until a desired crystallized phase appears in a sintered mass. In this case, it is possible to apply pressure ranging between 150 kg/cm$^2$ and 500 kg/cm$^2$. To obtain a crystallized phase it is often necessary to subject the mixture to a heat treatment before sintering.

The additive is present as a crystallized phase in a mass thus sintered. Table 1 below sets forth a typical structure of sintered bodies of this invention as analyzed by the X-ray diffraction process, together with the conditions in which the sintered bodies are produced.

TABLE 1

| Sample No. | Structure of a sintered body | Sintered condition | | | |
|---|---|---|---|---|---|
| | | Temperature | Hour | Pressure (kg/cm$^2$) | Additive |
| 1 | Si$_3$N phase + Si$_3$N$_4$ . Y$_2$O$_3$ compound phase (***) | 1800° C. | 2.0 | 350 | Y$_2$O$_3$ |
| 2 | Si$_3$N$_4$ phase + Si—Al—O—N compound phase (***) | 1700° C. | 1.5 | 300 | Al$_2$O$_3$ |
| 3 | Si$_3$N$_4$ phase + Si—Y—Al—O—N compound phase (***) | 1700° C. | 2.0 | 250 | Y$_2$O$_3$; Al$_2$O$_3$ |
| 4 | Si$_3$N$_4$ phase + Si—Ce—O—N compound phase (***) | 1700° C. | 2.0 | 250 | CeO$_2$ |
| 5 | Si$_3$N$_4$ phase + Si—Ce—Al—O—N compound phase | 1700° C. | 2.0 | 300 | CeO$_2$; Al$_2$O$_3$ |

TABLE 1-continued

| Sample No. | Structure of a sintered body | Sintered condition | | | Additive |
|---|---|---|---|---|---|
| | | Temperature | Hour | Pressure (kg/cm$^2$) | |
| 6 | $\alpha'$-Si$_3$N$_4$* phase + $\beta'$-Si$_3$N$_4$phase (*) + Si$_3$N$_4$ . Y$_2$O$_3$ compound phase | 1800° C. | 2.5 | 400 | Al$_2$O$_3$; Y$_2$O$_3$ |
| 7 | $\beta'$-Si$_3$N$_4$** phase | 1700° C. | 1.5 | 200 | Al$_2$O$_3$ |
| 8 | $\beta'$-Si$_3$N$_4$ phase + Si$_3$N$_4$ . Y$_2$O$_3$ compound phase (*) | 1800° C. | 3.0 | 350 | Al$_2$O$_3$; Y$_2$O$_3$** |
| 9 | $\beta'$-Si$_3$N$_4$** phase + Si—Al—O—N compound phase (***) | 1700° C. | 2.0 | 300 | Al$_2$O$_3$ |
| 10 | $\beta'$-Si$_3$N$_4$** phase + Si—Y—Al—O—N compound phase (***) | 1700° C. | 1.5 | " | Y$_2$O$_3$; Al$_2$O$_3$ |
| 11 | $\beta'$-Si$_3$N$_4$** phase + Si—Ce—O—N compound phase (***) | 1700° C. | 1.5 | " | CeO$_2$ |
| 12 | $\beta'$-Si$_3$N$_4$** phase + Si—Ce—Al—O—N compound phase (***) | 1700° C. | 2.0 | " | CeO$_2$; Al$_2$O$_3$ |
| 13 | $\alpha'$-Si$_3$N$_4$* phase | 1800° C. | 3.0 | 350 | Y$_2$O$_3$; Al$_2$O$_3$ |

Notes:
*the phase of $\alpha'$-Si$_3$N$_4$ is a solid solution phase of $\alpha$-Si$_3$N$_4$, and contains at least one of the previously described additive elements capable of forming a solid solution with silicon nitride.
**the phase of $\beta'$-Si$_3$N$_4$ is a solid solution phase of $\beta$-Si$_3$N$_4$, and contains at least one of the previously described additive elements capable of forming a solid solution with silicon nitride.
***A heat treatment at 1600° C. to 1800° C. and for scores of minute to several hours is required before sintering.

An article embodying this invention, wherein an additive added to silicon nitride is present as a crystallized phase in the sintered body, has a high resistance to corrosion by gallium phosphide and gallium arsenide, a high mechanical strength and a prominent resistance to thermal shocks. Therefore, the article of the invention has a wide industrial application as a type contacted by gallium phosphide or gallium arsenide.

FIG. 1 shows an apparatus 10 for manufacturing a single crystal of gallium phosphide or gallium arsenide. The apparatus 10 includes a crucible 14 placed in a pressure vessel 12 to which high pressure is applied. The crucible 14 holds a molten mass 16 of gallium phosphide or gallium arsenide melted by a heater (not shown) set around the crucible 14. A float 18 prepared from a sintered body embodying this invention rests on the molten mass 16. The float 18 has a central opening 20 defined by a wall having a tapered cross section. The float 18 is prevented from moving horizontally by four slender rods (not shown). Where a single crystal of gallium phosphide or gallium arsenide is grown, a seed crystal 22 fitted to a jig 26 is brought into contact with the molten mass 16 for a prescribed length of time in the opening of the float 18. Then, the seed crystal 22 is slowly pulled up by the jig 26, while rotating the jig 26, if necessary, thereby producing a desired single crystal 24 of gallium phosphide or gallium arsenide.

This invention will be more fully understood from the following examples. Throughout the examples, all parts and percentages are by weight.

EXAMPLE 1

A thorough mixture of silicon nitride powder containing 75% of $\alpha$ type silicon nitride and 5% based on the weight of the silicon nitride powder of yttria was molded into a parallelipiped mass. The mass was embedded in powder of aluminum nitride kept at 1700° C., and allowed to stand therein. The heat-treated mass was taken out and sintered in an atmosphere of nitrogen at 1800° C. at a pressure of 400 kg/cm$^2$, providing a parallelipiped sintered body measuring 10 mm × 10 mm × 50 mm. In this case, a plurality of sintered body sample shown in Table A below were prepared with different amounts of a vitreous phase by varying heat treatment time.

TABLE A

| Sample No. | Percentage content of a vitreous phase in a sintered body | Heat treatment time (min.) | Thickness of sintered body corroded off by gallium phosphide |
|---|---|---|---|
| 1 | 1.0 | 10 | 0.30 |
| 2 | 0.8 | 15 | 0.25 |
| 3 | 0.7 | 20 | 0.15 |
| 4 | 0.6 | 25 | 0.10 |
| 5 | 0.5 | 30 | 0.08 |
| 6 | 0.3 | 40 | 0.05 |
| 7 | 0.1 | 60 | 0.02 |
| 8 | 0.0 | 100 | 0.01 |

The sintered body samples were dipped 50 hours in a molten mass of gallium phosphide kept at 1450° C. Measurement was made of the thickness of the samples corroded off by gallium phosphide, the results being also set forth in Table A above. The percentage content of a vitreous phase in a sintered body given in Table A is represented by a value which was obtained by determining an amount of a Si$_3$N$_4$.Y$_2$O$_3$ compound from a data provided by the X-ray diffraction process with reference to a previously defined calibration line, finding a ratio between an amount of initially added yttrium and its content in said compound and subtracting a value of said ratio from 1.0. For reference, FIG. 2 shows an X-ray diffraction diagram of sample No. 8. The diagram was obtained using a Cu-k$_\alpha$ target at 35 kV and 15 mA. The scanning rate was 1°/min. and chart speed was 10 mm/min. The character P$_1$ of FIG. 2 relates to compound Si$_3$N$_4$.Y$_2$O$_3$ on a (121) plane, and P$_2$ and P$_3$ relate to $\beta'$-Si$_3$N$_4$.

EXAMPLE 2

Various additives given in Table B below were mixed with silicon nitride in amounts indicated therein. The mixtures were sintered under the conditions also shown in Table B to provide parallelipiped sintered body samples measuring 10 mm × 10 mm × 50 mm. The samples were dipped 50 hours in a molten mass of gallium phosphide (GaP) at 1450° C. and also in a molten mass of gallium arsenide (GaAs) at 1600° C. Measurement was made of the thickness of the sintered body samples which was corroded off by said molten masses. The results are set forth in Table C below. Table C also indicates the structure of the sintered body samples analyzed by the X-ray diffraction process.

substrate. This diode displayed a fully satisfactory function and had a prominently long effective life.

TABLE B

| Sample No. | Amounts of raw materials (parts) | | | | | | Heat treatment before sintering ** | Sintering condition | | |
|---|---|---|---|---|---|---|---|---|---|---|
| | $Si_3N_4$ | $Al_2O_3$ | $Y_2O_3$ | $CeO_2$ | MgO | $SiO_2$* | | Temp (°C) | Pressure (kg/cm²) | hour |
| 9 | 93 | 0 | 0 | 0 | 5 | 2 | None | 1700 | 350 | 2.0 |
| 10 | 91 | 3 | 5 | 0 | 0 | 2 | None | " | " | " |
| 11 | 93 | 0 | 5 | 0 | 0 | 2 | 1700° C. × 30 min. | 1800 | " | " |
| 12 | 91 | 3 | 4 | 0 | 0 | 2 | 1700° C. × 40 min. | " | " | 3.0 |
| 13 | 92 | 2 | 4 | 0 | 0 | 2 | 1750° C. × 40 min. | " | 400 | 2.5 |
| 14 | 93 | 5 | 0 | 0 | 0 | 2 | 1600° C. × 30 min. | 1700 | 300 | 1.5 |
| 15 | 90 | 5 | 3 | 0 | 0 | 2 | 1600° C. × 40 min. | " | 250 | 2.0 |
| 16 | 92 | 0 | 0 | 6 | 0 | 2 | 1700° C. × 30 min. | " | 250 | " |
| 17 | 91 | 3 | 0 | 4 | 0 | 2 | 1700° C. × 40 min. | " | 300 | 1.5 |
| 18 | 92 | 3 | 0 | 3 | 0 | 2 | None | " | " | 2.0 |
| 19 | 91 | 0 | 7 | 0 | 0 | 2 | None | " | " | " |

Note:
*Calculated value derived from analyzed value of $O_2$ in the raw materials.
**Conducted as in Example 1.

TABLE C

| Sample No. | Structure of sintered body samples | Extent of corrosion | |
|---|---|---|---|
| | | by GaP | by GaAs |
| 9 | $Si_3N_4$ phase + $MgO-SiO_2$ vitreous phase | x | x |
| 10 | $Si_3N_4$ phase + $Y_2O_3-SiO_2-Al_2O_3$ vitreous phase | x | x |
| 11 | $Si_3N_4$ phase + $Si_3N_4 \cdot Y_2O_3$ compound phase | o | o |
| 12 | $\beta'-Si_3N_4$ phase + $Si_3N_4 \cdot Y_2O_3$ compound phase | ⊚ | o |
| 13 | $\alpha'-Si_3N_4$ phase + $\beta'-Si_3N_4$ phase + $Si_3N_4 \cdot Y_2O_3$ compound phase | ⊚ | o |
| 14 | $Si_3N_4$ phase + Si—Al—O—N compound phase | o | o |
| 15 | $Si_3N_4$ phase + Si—Y—Al—O—N compound phase | o | o |
| 16 | $Si_3N_4$ phase + Si—Ce—O—N compound phase | o | o |
| 17 | $\beta'-Si_3N_4$ phase + Si—Ce—Al—O—N compound phase | ⊚ | o |
| 18 | $Si_3N_4$ + $CeO_2-SiO_2—Al_2P_3$ vitreous phase | x | x |
| 19 | $Si_3N_4$ phase + $Y_2O_3-SiO_2$ vitreous phase | x | x |

Notes:
x = larger corroded thickness than 0.2 mm
o = smaller corroded thickness between 0.05 to 0.2 mm
⊚ = smaller corroeded thickness between 0.05 to 0.2 mm Table C above shows that where the main component of silicon nitride was sintered with an additive such as alumina, yttria or ceria to provide a solid solution or compound in which said additive was present as a crystallized phase, then the sintered body was little corroded by gallium phosphide or gallium arsenide, displaying a prominently high resistance to corrosion thereby. In contrast, the sintered body sample in which an additive formed a vitreous matter was noticeably corroded by gallium phosphide or gallium arsenide, that is, had low corrosion resistance.

EXAMPLE 3

A float as shown in FIG. 1 was prepared from a sintered body having the same structure as Sample 12 of Example 2. A single crystal of gallium phosphide or gallium arsenide was grown, using said float. Though contacted 7 hours by a molten mass of gallium phosphide or gallium arsenide during the growth of a single crystal thereof, the float was little corroded. A slice was cut out of the single crystal of, for example, gallium phosphide. A light-emitting diode was prepared by the customary liquid phase growth with the slice used as a

What we claim is:

1. An article having at least a portion which directly contacts molten gallium phosphide or gallium arsenide, said contacting portion comprising: a sintered body of silicon nitride and a total of from 0.5% to 20% by weight, based on said silicon nitride, of an additive selected from the group consisting of 0.01% to 10% by weight based on said silicon nitride, of aluminum oxide, 0.5% to 20% by weight, based on said silicon nitride, of cerium oxide and mixtures thereof, said additive being in the form of a compound selected from the group consisting of Si-Ce-O-N, Si-Ce-Al-O-N and mixtures thereof depending upon the additive selected, and at least a portion of said additive being present in said sintered body as a crystallized phase.

2. The article according to claim 1, wherein said silicon nitride phase is a mixture of $\alpha'-Si_3N_4$ and $\beta'-Si_3N_4$.

3. The article according to claim 1, wherein the sintered body is formed of a phase of $\alpha'-Si_3N_4$.

4. The article according to claim 1, wherein the sintered body is formed of a phase of $\beta'-Si_3N_4$.

* * * * *